United States Patent [19]
Wu et al.

[11] Patent Number: 5,164,916
[45] Date of Patent: Nov. 17, 1992

[54] HIGH-DENSITY DOUBLE-SIDED MULTI-STRING MEMORY MODULE WITH RESISTOR FOR INSERTION DETECTION

[75] Inventors: Andrew L. Wu, Shrewsbury; Derrick D. DaCosta, Fraimingham; Stephen R. Coe, Aushburnham; Donald C. Pierce, Fitchburg; E. William Bruce, II, Luenenburg, all of Mass.

[73] Assignee: Digital Equipment Corporation, Maynard, Mass.

[21] Appl. No.: 861,276

[22] Filed: Mar. 31, 1992

[51] Int. Cl.⁵ .............................................. G11C 5/04
[52] U.S. Cl. ........................................ 365/52; 365/63; 365/92; 365/174; 365/230.03; 361/395
[58] Field of Search ..................... 365/52, 63, 174, 92, 365/230.03; 361/395

[56] References Cited

U.S. PATENT DOCUMENTS

| | | | |
|---|---|---|---|
| 4,266,282 | 5/1981 | Henle et al. | 365/52 |
| 4,375,665 | 3/1983 | Schmidt | 365/63 |
| 4,426,689 | 1/1984 | Henle et al. | 365/52 |
| 4,656,605 | 4/1987 | Clayton | 365/52 |
| 4,727,513 | 2/1988 | Clayton | 365/52 |
| 4,813,014 | 3/1989 | De Bell | 365/52 |
| 4,849,944 | 7/1989 | Matsushita | 365/52 |
| 4,958,322 | 9/1990 | Kosugi et al. | 365/63 |
| 5,016,223 | 5/1991 | Kimura et al. | 365/52 |
| 5,025,415 | 6/1991 | Masuyama et al. | 365/52 |
| 5,089,993 | 2/1992 | Neal et al. | 365/230.03 |
| 5,119,338 | 6/1992 | Saito | 365/52 |

FOREIGN PATENT DOCUMENTS

| | | | |
|---|---|---|---|
| 57-82291 | 5/1982 | Japan | 365/52 |
| 60-234286 | 11/1985 | Japan | 365/52 |
| 62-245597 | 10/1987 | Japan | 365/52 |

OTHER PUBLICATIONS

Samsung MOS Memory Data Book, vol. 1, United States, 1991, pp. 509–675.
"Intel iSM001DR09P (9-chip) 1M×9 (1,048,576×9) Dynamic RAM Memory Module with Fast Page Mode," United States, 1991, pp. 7-111 to 7-112.
Texas Instruments TM124 MBK36A 1,048,576 by 36-Bit Dynamic RAM Module Houston, Tex., 1991, pp. 6-89 to 6-95.

Primary Examiner—Joseph E. Clawson, Jr.
Attorney, Agent, or Firm—Arnold, White & Durkee

[57] ABSTRACT

A high-density memory module has thirty-two memory integrated circuit chips, sixteen decoupling capacitors, and two resistors mounted on a double-sided multi-layer printed wiring board having a series of edge terminals for connection to a motherboard. One side of the board has a first 2×8 rectangular matrix of the chips, and the other side of the board has a second 2×8 matrix of the chips. The chips are grouped into four "strings," each of which includes eight chips which receive the same row address strobe and column address strobe. Each string is selected by a unique row address strobe. All four strings share a common data bus. Two of the strings share a first column address strobe and a first address bus, and the other two strings share a second column address strobe and a second address bus, to facilitate four-way interleaved memory access. Address, data, power, and ground terminals are distributed and dispersed along the series of edge terminals, but terminals for one address bus is disposed between a first half and a second half of the terminals for the other address bus. One of the two resistors is used for indicating the type of the memory chips in the memory module, and the other resistor is interconnected with similar resistors in other memory modules on the motherboard to provide a combined resistance indicating the number of memory modules on the motherboard.

20 Claims, 10 Drawing Sheets

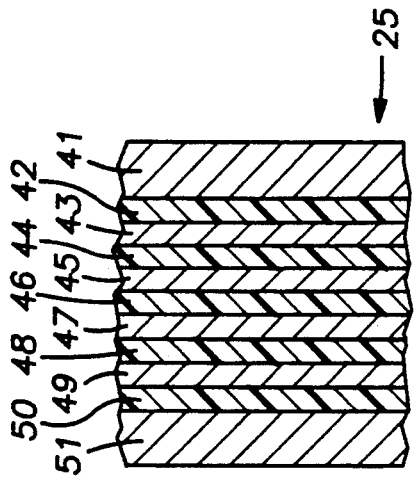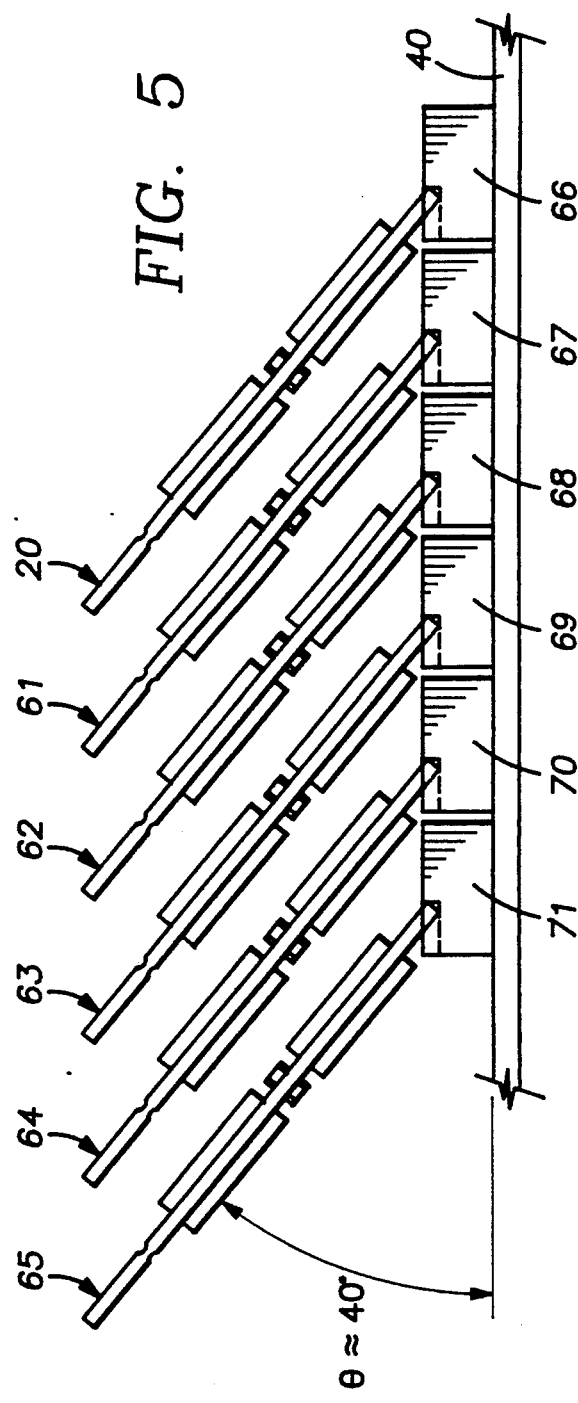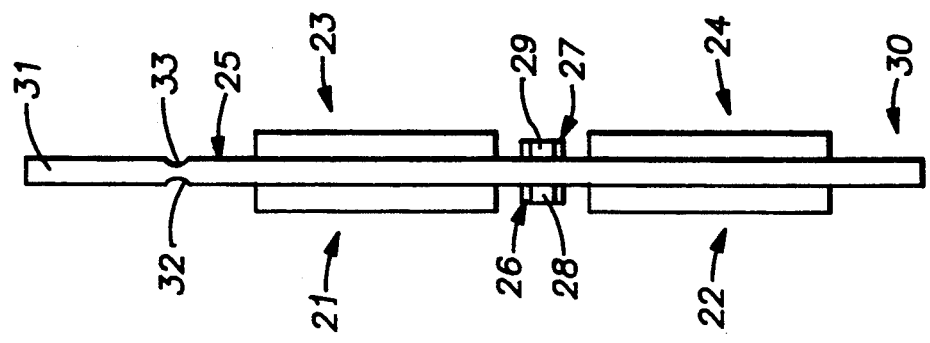

HIGH-DENSITY DOUBLE-SIDED MULTI-STRING MEMORY MODULE WITH RESISTOR FOR INSERTION DETECTION

BACKGROUND OF THE INVENTION

I. Technical Field

The present invention relates to electronic memories and more particularly to modular memories having a plurality of semiconductor integrated circuits for the storage and retrieval of words of binary data.

II. Description of the Related Art

High-speed random access memory for digital computers is typically provided by dynamic random access semiconductor memory chips, known in the art as "DRAMs." To achieve a high packing density of DRAMs in a computer system, a main memory unit for a digital computer typically includes a plurality of memory modules, each of which is comprised of a plurality of DRAMs mounted on a printed wiring board. The printed wiring boards are mounted at an angle with respect to a so-called "mother" board. The DRAMs of a memory module are typically mounted on both sides of the printed wiring board, and the printed wiring board has an edge portion with a series of terminals for connection to the motherboard. The DRAMs have address inputs which are wired in parallel to address lines. The individual DRAMs on the printed wiring board are selected by row address strobe (RAS) and column address strobe (CAS) signals. The DRAMs on the printed wiring board are subdivided into groups called "strings" such that all of the DRAMs in a string share the same RAS and CAS signals and therefore simultaneously read or write data at the same address to or from a data bus. In particular, a DRAM will read or write data in response to the column address strobe.

Due to continual improvements in semiconductor fabrication technology, it is possible to store an increasing amount of data on a single DRAM chip and, at the same time, the power dissipation per bit of storage has decreased and the speed of data access has increased. Consequently, it is possible to pack a large number of DRAM chips into a very small volume without running into power dissipation problems, yet there is a difficulty in providing address, data, and control connections to the chips in such a dense packing configuration. Therefore, memory designers are presented with the problem of obtaining high packing densities without introducing manufacturing difficulties or causing noise due to cross-coupling or reflections on the interconnecting lines carrying the high-speed address, data and control signals.

SUMMARY OF THE INVENTION

In accordance with one aspect of the invention, a double-sided multi-string memory module has a first 2×8 matrix of memory integrated circuit chips on one side of a multi-layer printed wiring board and a second 2×8 matrix of memory integrated circuit chips on the other side of the printed wiring board. The memory chips are grouped into four "strings," each of which includes eight of the chips. The strings share a common data bus having data lines, each of which is connected to a data terminal of a memory chip in each of the four strings. The chips in each string are connected in parallel to the same row address strobe line and column address strobe line so that all chips in each string are accessed simultaneously. Each string has a unique row address strobe. The four strings are further organized into two memory banks, each of which includes a pair of strings sharing the same column address strobe line. The memory chips in the first bank are wired in parallel to a first address bus, and the memory chips in the second bank are wired in parallel to a second address bus.

In accordance with a subsidiary feature of the invention, the routing of the address buses on the printed wiring board is facilitated by a physical organization wherein the first and second strings of memory chips are mounted on one side of the printed wiring board, the third and fourth strings are mounted on the other side of the printed wiring board, each chip in the first string is in registration with a corresponding chip in the third string, and each chip in the second string is in registration with a corresponding chip in the fourth string. In accordance with another subsidiary feature of the invention, the printed wiring board has an edge portion with series of terminals for connection to a motherboard. Power, ground, address, data and control terminals are distributed and dispersed along the series of terminals, and terminals for one of the address buses is disposed between a first half and a second half of the terminals for the other address bus.

In accordance with yet another subsidiary feature of the invention, the memory chips are encased in thin packages having a thickness of about 0.05 inches, and the printed wiring board has a thickness of 0.05 inches, so that the memory module has a thickness of about 0.15 inches.

In accordance with another aspect of the invention, the memory module has a resistor connected to a terminal in the series of terminals. A multiplicity of similar memory modules are inserted into connectors on a motherboard. The motherboard has wiring to a plurality of these connectors for interconnecting the resistors of memory modules inserted into the plurality of connectors to provide a combined resistance responsive to insertion or removal of memory modules from the plurality of connectors. A logic circuit is responsive to the combined resistance to determine whether or not a predetermined number of the memory modules are inserted into the plurality of connectors.

BRIEF DESCRIPTION OF THE DRAWINGS

Other objects and advantages of the invention will become apparent upon reading the following detailed description and upon reference to the drawings in which:

FIG. 3 is a side view of the memory module of FIG. 1;

FIG. 4 is a cross-section showing copper and fiberglass layers making up the printed wiring board of the memory module of FIG. 1;

FIG. 5 illustrates an arrangement for mounting a plurality of memory modules each as shown in FIG. 1 at an angle with respect to a motherboard;

Figure 1:
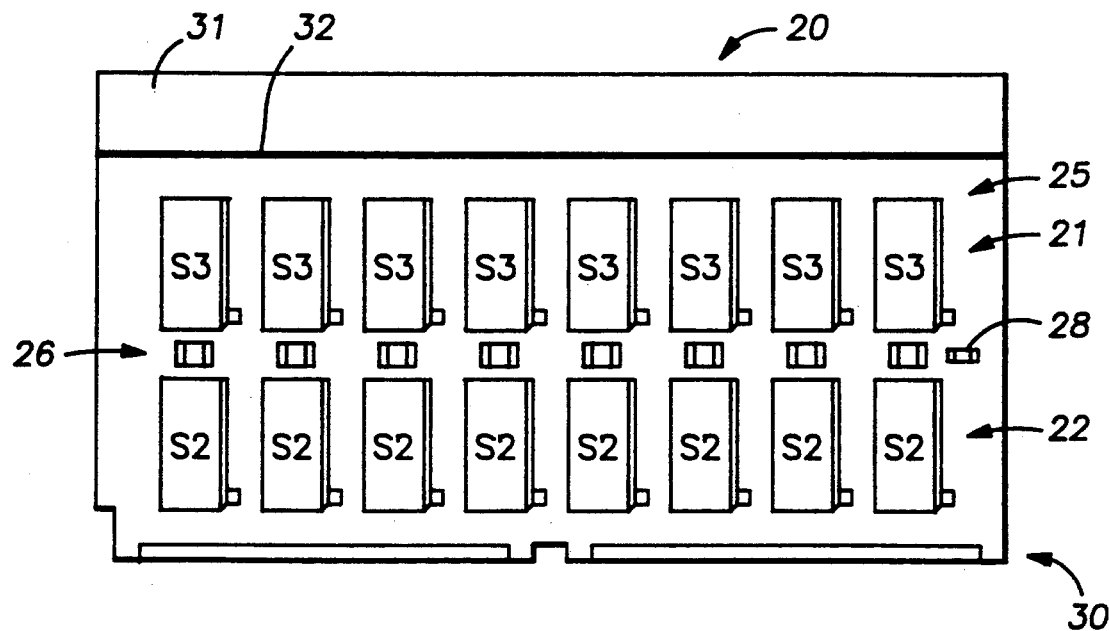
FIG. 1 is a plan view of a top side of a memory module in accordance with the present invention.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the scope of the invention as defined by the appended claims.

DETAILED DESCRIPTION OF THE PREFERRED EMBODIMENT

Figure 2:
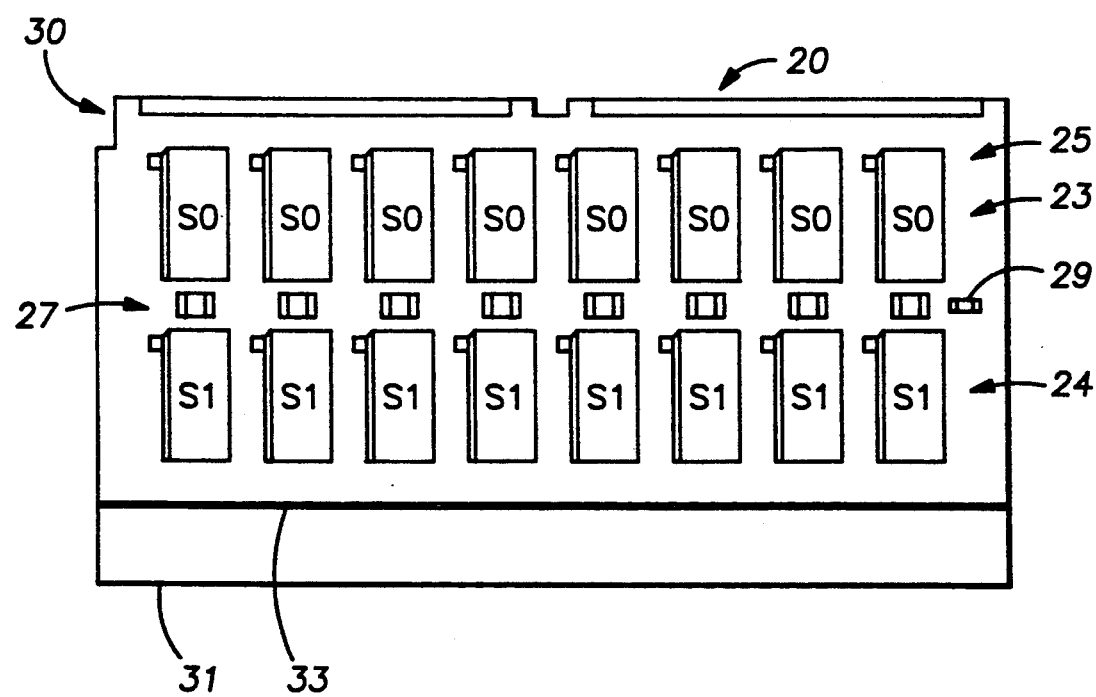
FIG. 2 is a bottom view of the memory module of FIG. 1.

Turning now the drawings, there is shown in FIG. 1 a top view of a memory module generally designed 20 in accordance with the present invention. A bottom view of the same memory module 20 is shown in FIG. 2. The memory module 20 includes four rows of dynamic random access memory (DRAM) integrated circuit chips 21, 22, 23, and 24 mounted on a printed wiring board 25. The chips 21, 22 are arranged as a first rectangular matrix of two rows and eight columns on one side of the printed wiring board 25, and the chips 23, 24 are arranged as a second rectangular matrix of two rows and eight columns on the other side of the printed wiring board. Also mounted on the printed wiring board are sixteen ceramic decoupling capacitors which are arranged as a row of eight capacitors 26 shown in FIG. 1 between the rows 21 and 22 of DRAMs, and a row 27 of eight capacitors disposed between the rows 23 and 24 of DRAMs in FIG. 2. The memory module 20 further includes a resistor 28 shown in FIG. 1 that is provided for sensing whether or not a memory module is removed from a motherboard as further shown in FIG. 5 and further described below with reference to FIG. 13.

Figure 8:
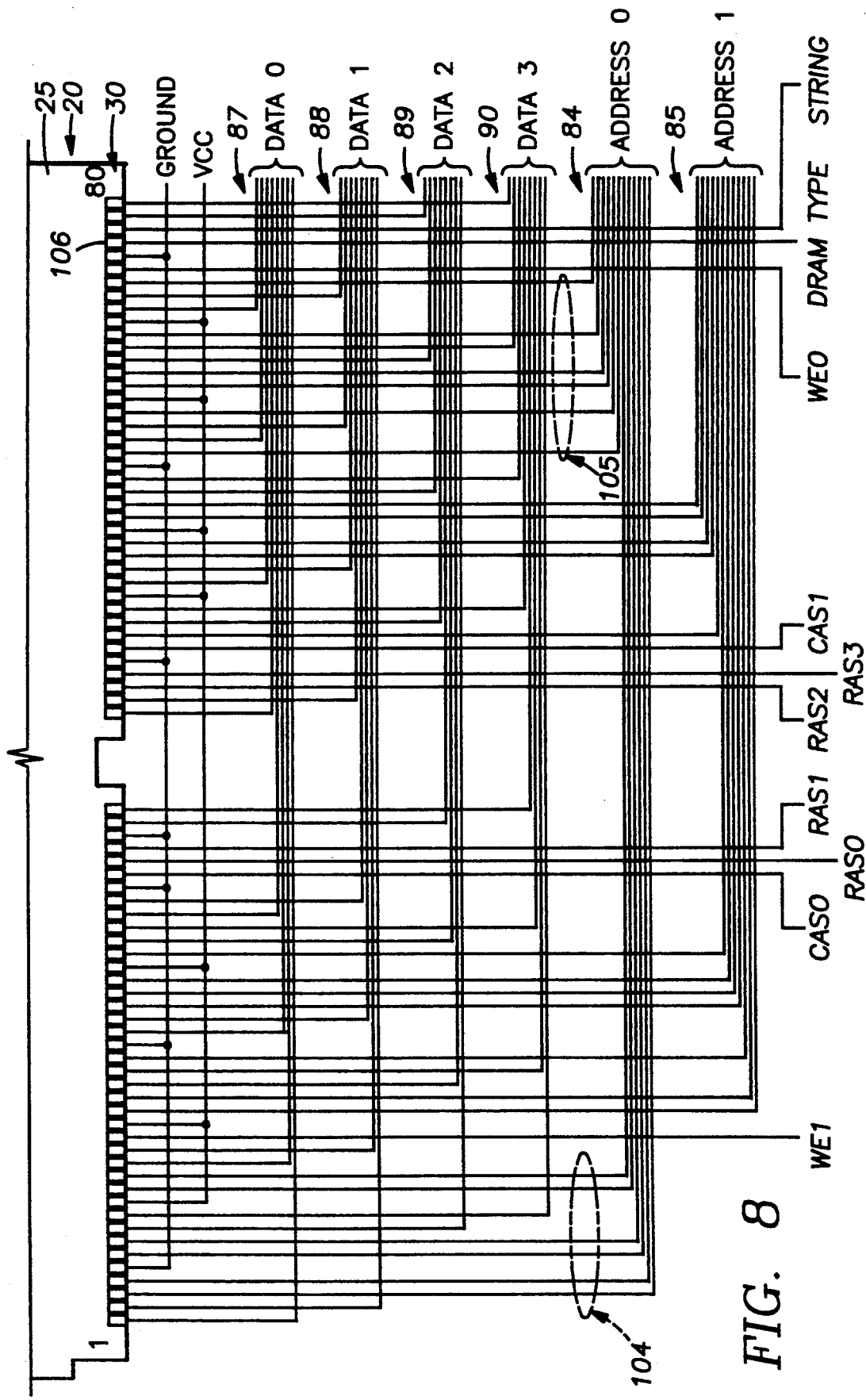
FIG. 8 is a schematic diagram showing the arrangement of address, data and control signals along a series of terminals at an edge portion of the memory module of FIG. 1.

As shown in FIG. 2, the memory module 20 includes a second resistor 29 used for indicating the type of DRAMs 21, 22, 23, 24 included in the memory module. Preferably each memory module includes either all 1M×4 DRAMs, or includes all 4M×4 DRAMs. If the memory module has all 1M×4 DRAMs, as shown in FIGS. 1 and 2, a resistor 29 is mounted on the board to provide a connection from a "DRAM TYPE" terminal (160 in FIG. 8) to ground to assert a logic low signal on the "DRAM TYPE" terminal. The edge connector terminal assignments, as shown in FIG. 8 and listed below in TABLE I, are the same regardless of the type of DRAM used in the memory module. The printed wiring board (not shown) for a memory module including all 4M×4 DRAMs is similar to the printed wiring board 25 for all 1M×4 DRAMs except a similar resistor can be mounted to provide a connection from the "DRAM TYPE" terminal to the power supply voltage VCC. In this fashion, when the memory modules are installed on the mother board 40 as shown in FIG. 5, a logic signal is asserted on the "DRAM TYPE" terminal of each memory module that is a logic low for each memory module of 1M×4 DRAMS and that is a logic high for each memory module of 4M×4 DRAMS. Specific resistor values can be chosen to simulate a logic signal of a desired logic family. To simulate a standard TTL logic signal, for example, the resistor 29 on the 1M×4 DRAM memory module 20 should be zero or a few ohms, and the similar resistor on the 4M×4 DRAM memory module (not shown) should be about 130 ohms. To simulate a standard CMOS logic signal, the resistor 29 on the 1M×4 DRAM memory module 20 should be about 330 ohms, and the similar resistor on the 4M×4 DRAM memory module (not shown) should be about 330 ohms. Instead of using a standard TTL or CMOS logic circuit on the motherboard to receive the DRAM TYPE signal, however, the motherboard could use a comparator and either a so-called "pull-up" or "pull-down" resistor, so that the memory modules need not provide standard logic signals In this case either the resistor 29 on the 1M×4 DRAM memory module 20 or the similar resistor on the 4M×4 DRAM memory module (not shown) could be omitted. In any case, the resistances should be compatible with the circuitry on the motherboard (40 in FIG. 5) intended to receive the DRAM TYPE signal.

In one preferred memory system all of the memory modules installed on a motherboard would include only either 1M×4 DRAMS or 4M×4 DRAMS. In this case the DRAM TYPE signals from all of the memory modules on the motherboard could be wired in parallel to the circuitry on the motherboard to provide a combined signal. In this case, if a resistor 29 is used on the 1M×4 DRAM memory module 20 and a similar resistor is used on the 4M×4 DRAM memory module, then the sum of the two resistances should not be a very low value, because otherwise a "short circuit" condition across the power and ground wiring would occur if 1M×4 DRAM memory modules were inadvertently mixed with 4M×4 DRAM memory modules on the same motherboard.

Ground, power, data, address, and control signals are conveyed to and from the memory module 20 via a series of terminals generally designated 30 disposed along an edge portion of the printed wiring board 25. Preferably, the terminals 30 are leadless gold on nickel plated fingers. There are eighty fingers on each side of the printed wiring board 25. Each finger on one side of the board is electrically connected to the finger connection directly opposite to it on the other side of the board to provide redundant connections for increased reliability.

The memory module 20, as shown in FIGS. 1 and 2, has a width of 2.500 inches and a length of 4.650 inches. The printed wiring board 25 has a border area 31 having a width of 0.450 inches which is set off from the rest of the board by scoring 32 and 33. To protect the DRAMs from rough handling, the memory module 20 is shipped with the border area 31 intact, but the border area can be removed at the option of the recipient to decrease the size of the memory module where space is a critical factor. Otherwise, the border area 31 can be left in place and used as a handle to facilitate the insertion and removal of the memory module 20 from a motherboard 40, as shown in FIG. 5.

As shown in the side view of FIG. 3, the memory module 20 has a narrow thickness, of about 0.150 inches. The printed wiring board 25 has a thickness of about 0.050 inches, and each of the DRAMs 21, 22, 23, 24 has a thickness of about 0.050 inches. The narrow thickness of the DRAMs is a characteristic of the TSOP type II packaging. TSOP stands for "thin, small outline package" which is a standard package offered by the major DRAM manufacturers, such as Texas Instruments, Hitachi, and Mitsubishi.

Figure 9:
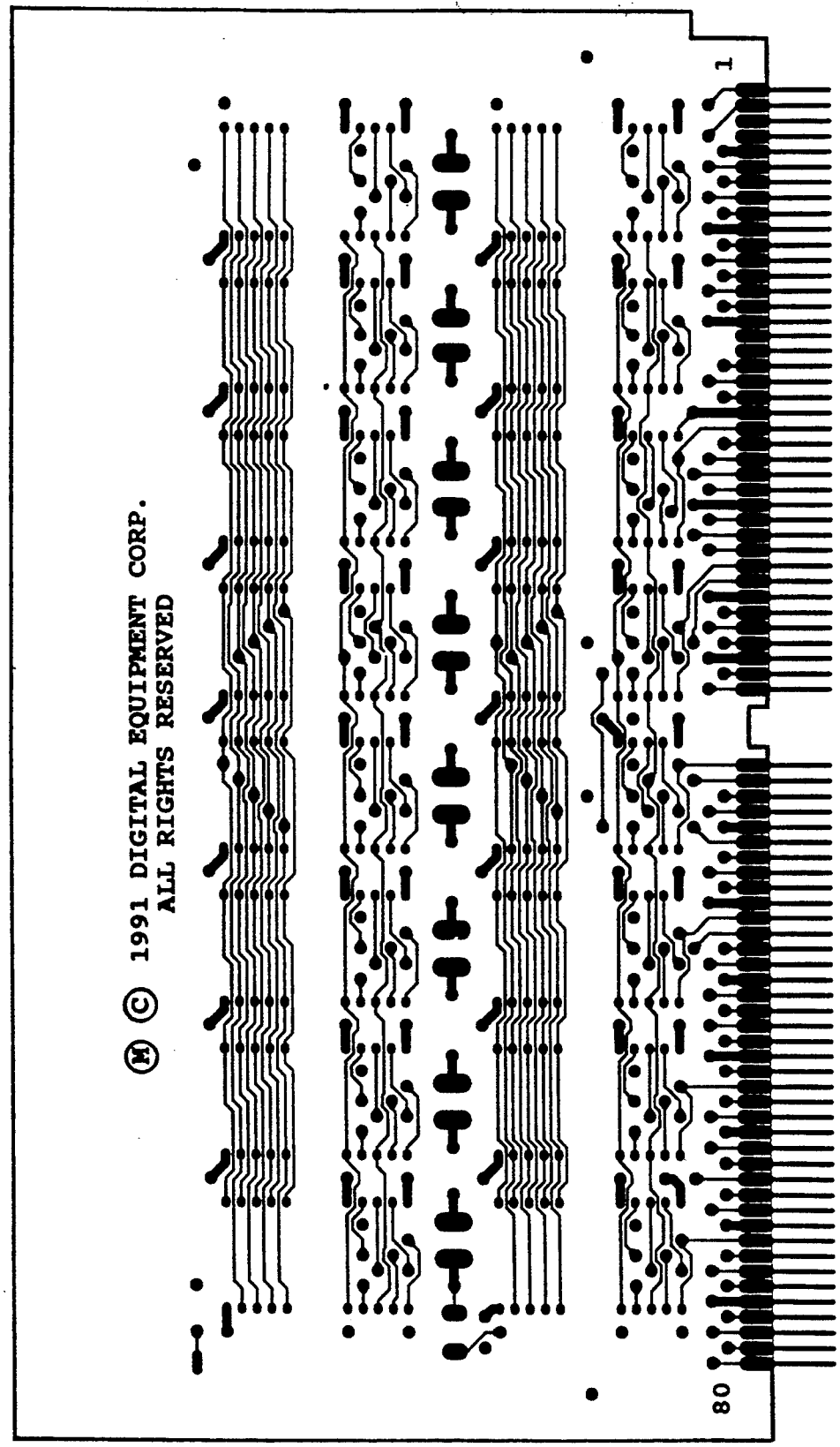
FIG. 9 is a reproduction of a mask work for a first conductive layer of the printed wiring board of the memory module of FIG. 1.
Figure 10:
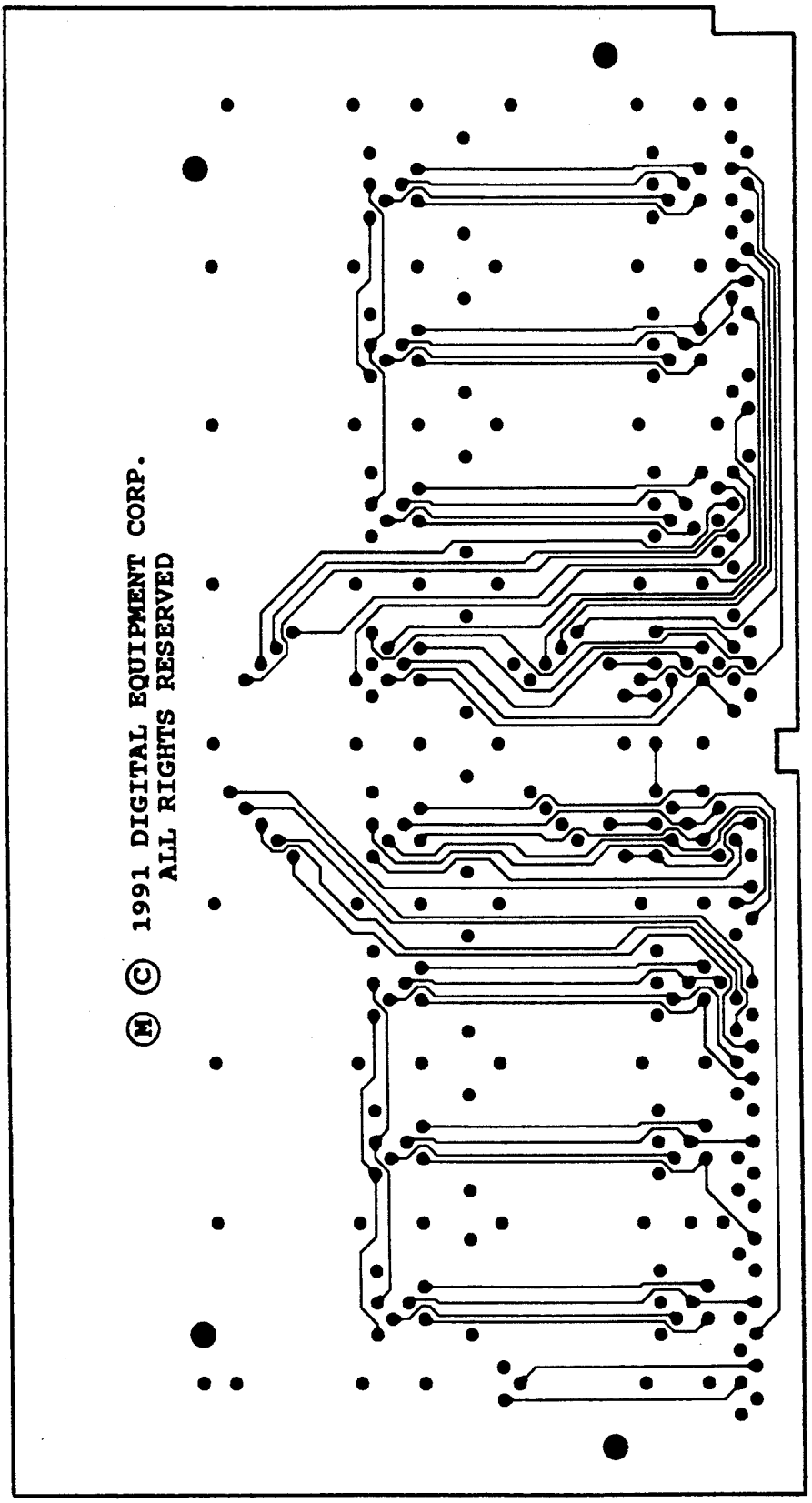
FIG. 10 is a reproduction of a mask work for a second conductive layer of the printed wiring board for the memory module of FIG. 1.
Figure 11:
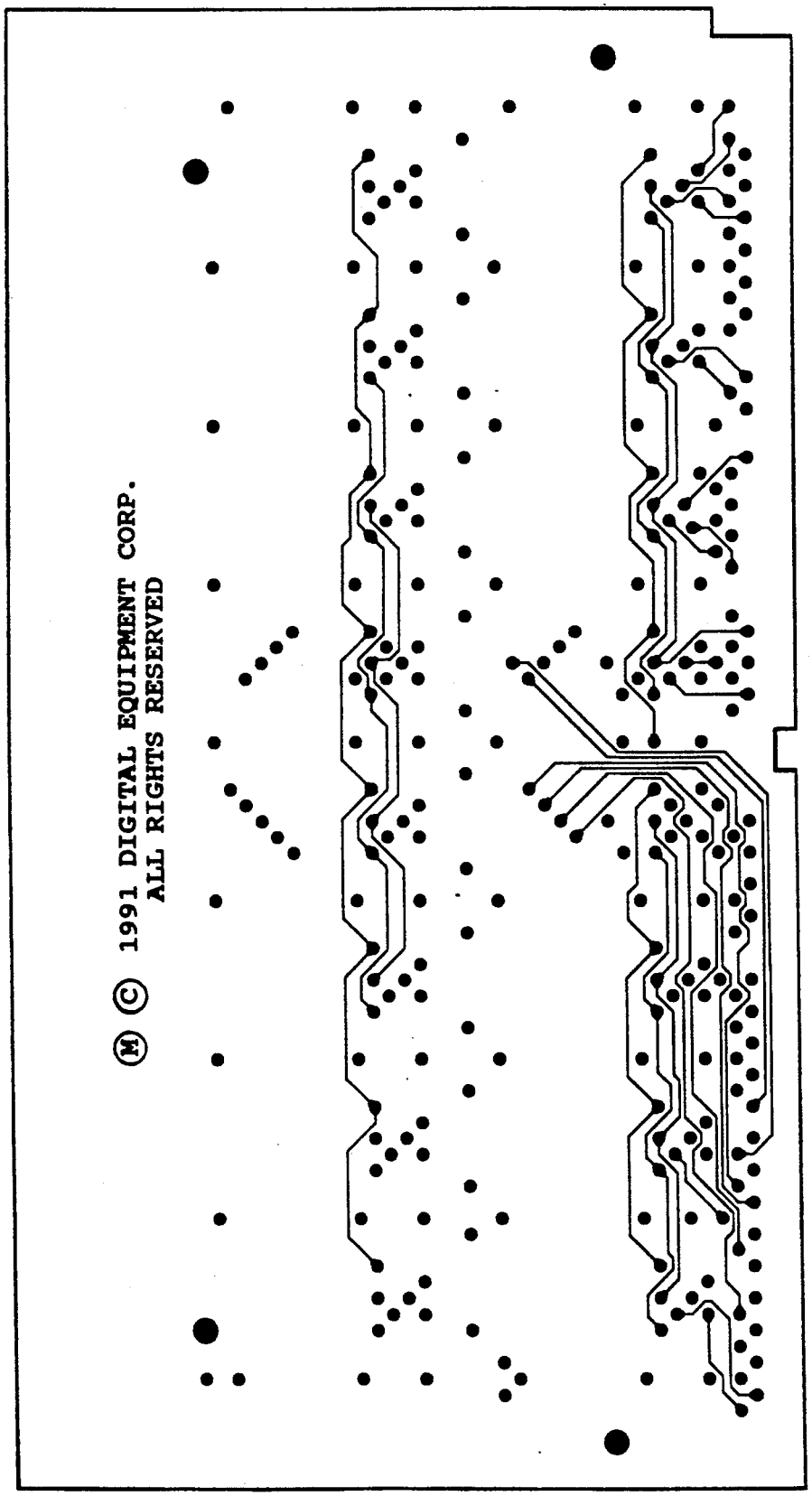
FIG. 11 is a reproduction of a mask work for a fifth conductive layer of the printed wiring board of the memory module of FIG. 1.
Figure 12:
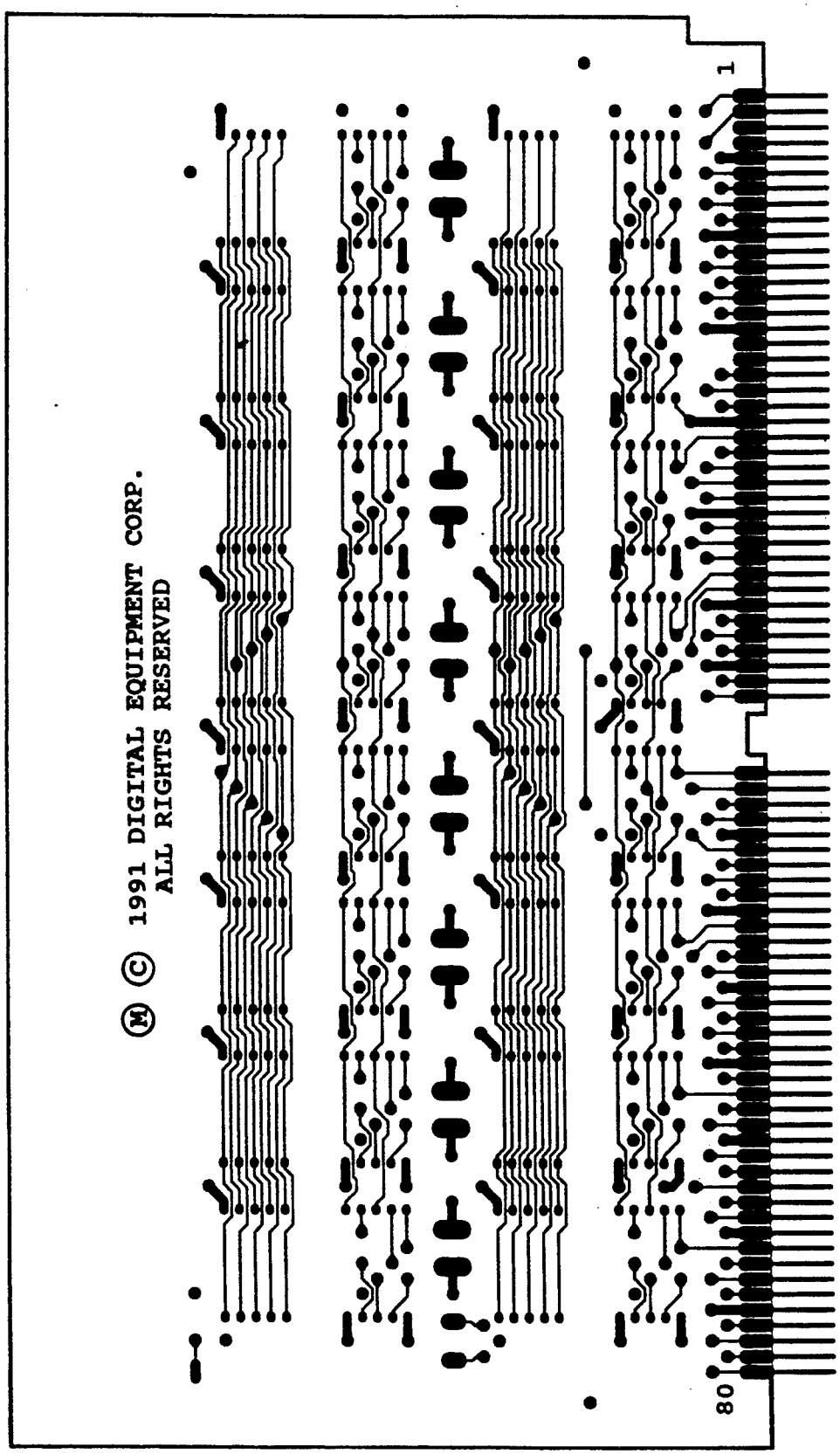
FIG. 12 is a reproduction of a mask work for a sixth conductive layer of the printed wiring board of the memory module of FIG. 1.

Turning now to FIG. 4, there is shown a cross-section of the printed wiring board 25. The printed wiring board 25 consists of eleven alternate copper and type FR4 epoxy-fiberglass layers. The first layer 41 is a copper layer having a thickness of 0.0014 inches. This first layer 41 is etched using standard photolithographic techniques to form a conductor pattern illustrated by the mask work shown in FIG. 9. The first layer 41 is separated by a 0.009 inch fiberglass layer 42 from a second copper layer 43. This second copper layer 43 has a thickness of 0.0007 inches, and it is etched to have a conductor pattern defined by the mask work shown in FIG. 10. This second copper layer 43 is separated from a 0.008 inch fiberglass layer 44 from a 0.0007 inch planar copper layer 45 providing a positive power supply voltage. This third copper layer 45 is separated by a 0.008 inch fiberglass layer 46 from a 0.0007 inch copper ground plane layer 47. This fourth copper layer 47 is separated by a 0.0008 inch fiberglass layer 48 from a fifth copper layer 49. The fifth copper layer 49 has a thickness of 0.0007 inches, and it is etched to form a conductor pattern defined by the mask work shown in FIG. 11. The fifth copper layer 49 is separated by a 0.009 inch fiberglass layer 50 from a sixth copper layer 51. The sixth copper layer 51 has a thickness of 0.0014 inches, and it is etched to form a conductor pattern defined by the mask work shown in FIG. 13.

Turning now to FIG. 5, there is illustrated the preferred way of mounting the memory module 20 along with other similar memory modules 61, 62, 63, 64, 65 to a common motherboard 40. The motherboard 40 has, for each of the memory modules, a respective edge connector socket 66, 67, 68, 69, 70, 71. Each of the edge connector sockets receives its respective memory module at an angle of about 40° with respect to the motherboard 40.

Figure 6:
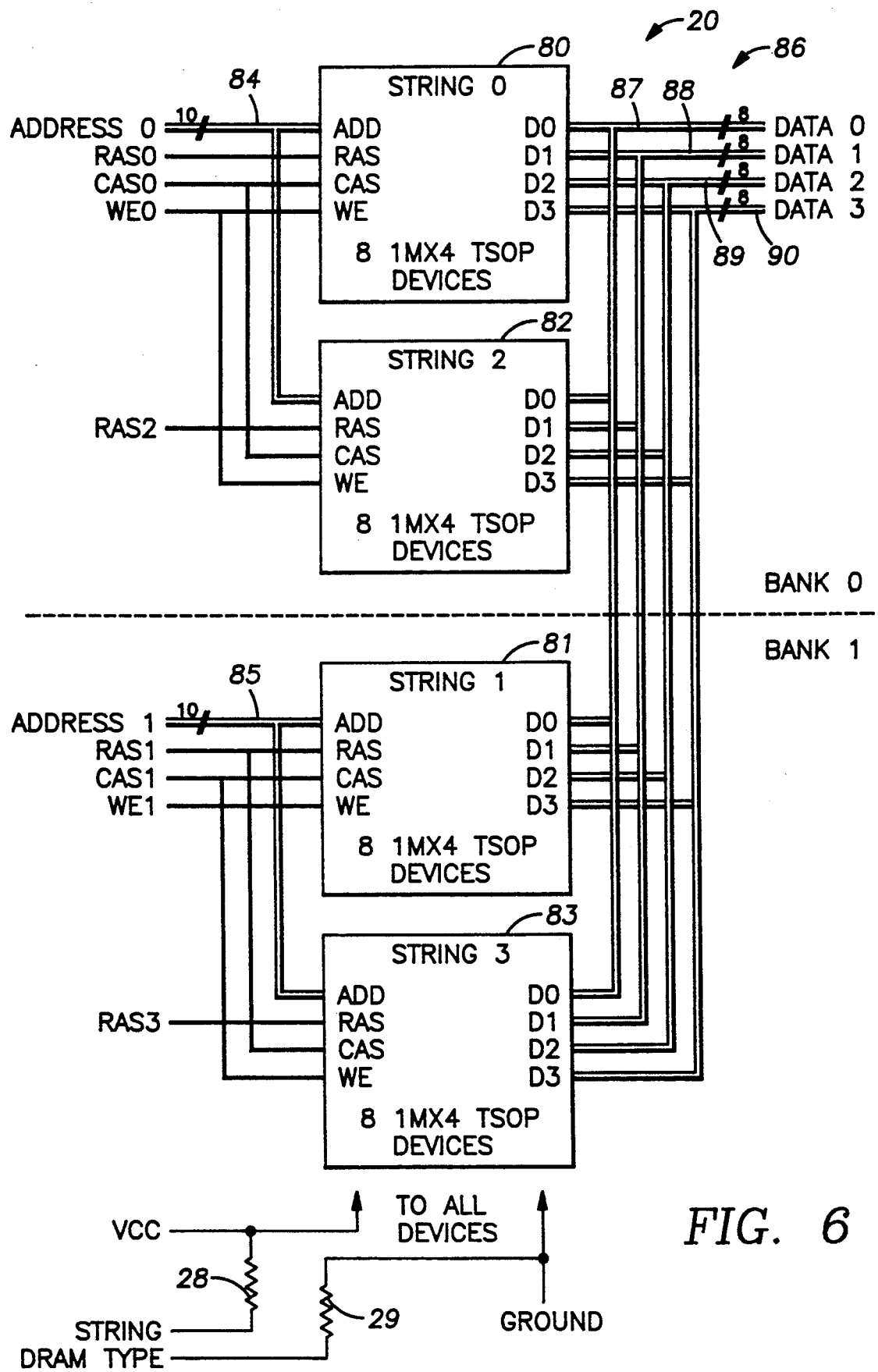
FIG. 6 is a block diagram showing the organization of the memory circuits in the memory module of FIG. 1.

Turning now to FIG. 6, there is shown a block diagram of the organization of the memory circuits on the memory module 20 of FIG. 1. The DRAMs are organized as four separate strings 80, 81, 82, 83, each of which includes eight DRAMs. Each string is connected to the same row address strobe and column address strobe. Each of the four strings has a separate combination of row address and column address strobes. In other words, data are simultaneously read from or written to all of the DRAMs in a selected one of the four strings. The two strings 80, 82 are organized as a first bank (Bank 0), and the strings 81, 83 are organized as a second bank (Bank 1). The strings 80, 82 share a common address bus 84 carrying a first set of address signals over ten lines that make up the address bus 84. The strings 80, 82 further share a common column address strobe (CAS 0), and a common write enable line (WE 0). In a similar fashion, the two strings 81, 83 that make up the second memory bank (Bank 1) share a second common address bus 85 having ten lines that convey a second address (ADDRESS 1), and the strings 81, 83 also share a common column address strobe (CAS 1) and a common write enable line (WE 1).

The memory organization shown in FIG. 6 uses thirty-two 1M×4 TSOP type II DRAM devices to provide a 16 megabyte memory module 20. Alternatively, thirty-two 4M×4 TSOP type II DRAM devices could be used instead of 1M×4 DRAMs to provide a 64 megabyte memory module. In this alternative case, each of the common address buses 84, 85 convey twelve address lines to the respective DRAMS.

The data bus 86 has 32 data lines. Each one of the 32 data lines is connected to one of the eight DRAMs in each of the four strings 80, 81, 82, 83. Each one of the 32 data lines in the data bus 86 is also connected to a respective one of the four different data outputs (D0, D1, D2, D3) of each of the DRAMs. Therefore, as shown in FIG. 6, the data bus 86 can be further subdivided into four separate 8-line data busses 87, 88, 89, 90. The data bus 87, for example, includes data lines to only the "D0" data terminals of the DRAMs, the data bus 88 includes only data lines to the "D1" data terminals of the DRAMs, the data bus 89 includes only data lines to the "D2" data terminals of the DRAMs, and the data bus 90 includes only data lines to the "D3" data terminals of the DRAMs.

In one preferred use of the memory module 20, the two least significant bits of a physical address select the particular one of the four strings so that the physical address space is interleaved among the four strings. If the two least significant address bits are $00_2$, for example, then the first string 80 is selected. If the two least significant address bits are $01_2$, then the second string 81 is selected. If the two least significant address bits are $10_2$, then the third string 82 is selected. If the two least significant address bits are $11_2$, then the fourth string 83 is selected. In other words, the two least significant address bits designate a string number which is either 0, 1, 2 or 3, as shown in the labels in FIG. 6. The actual selection of a particular string is performed by asserting either the first row address signal RAS 0 to select the first string 80, or asserting the second row address strobe RAS 1 to select the second string 82, or asserting the third row address strobe RAS 2 to select the third string 82, or asserting the fourth row address strobe RAS 3 to select the fourth string 83.

A particular string is accessed by setting up the address bits, the column address strobe, the write enable signal, and the column address strobe in the conventional fashion for a conventional DRAM. Because the strings are organized into two separate banks, however, all of the strings can share the same data lines without any decrease in speed because two cycles over an address bus are required for each single cycle of data transfer over the data bus. When Bank 0, for example, is performing a data transfer over the data bus 86, a row address can be supplied over the second address bus 85 to one of the strings 81 or 83 in the second bank (Bank 0).

As an example of the conventional method of accessing the strings, suppose it is desired to read data from the first string 80. The row address is asserted on the ten address lines (ADDRESS 0—0 to ADDRESS 0—9) of the first address bus 86. After a certain address setup time specified by the manufacturer of the DRAMs, a RAS 0 signal is asserted on the RAS 0 line. This RAS 0 signal selects the first string 80 for data transfer. Then the column address is asserted on the ten address lines (ADDRESS 0—0 to ADDRESS 0—9) of the first address bus 86, while the WE 0 line is held de-asserted. After a certain address setup time specified by the manufacturer of the DRAMs, a CAS 0 signal is applied to the CAS 0 line. In response to the CAS 0 signal, the DRAMs in the first string 80 assert thirty-two bits of data upon the data bus 86.

Data are read in a similar fashion from a selected one of the other strings, by asserting RAS and CAS signals on the RAS and CAS lines tied to the selected one of the other strings. Because all four strings share a common data bus, data can be read from only one string at a time when asserting a CAS signal, or else data contention errors may occur.

To perform a write operation instead of a read operation, a similar procedure is followed, except the respective write enable signal (WE0 or WE1) is asserted when the respective column address is asserted and the respective CAS signal is asserted.

As further shown in FIG. 6, ground and a positive supply voltage (VCC) is supplied to all of the DRAMs in all of the strings. The resistor 28 is connected from the positive supply VCC and a line conveying a "STRING" signal. In a similar fashion, when the resistor 29 is present, it is connected between the supply voltage VCC and a line conveying a "DRAM NO." signal.

Figure 7:
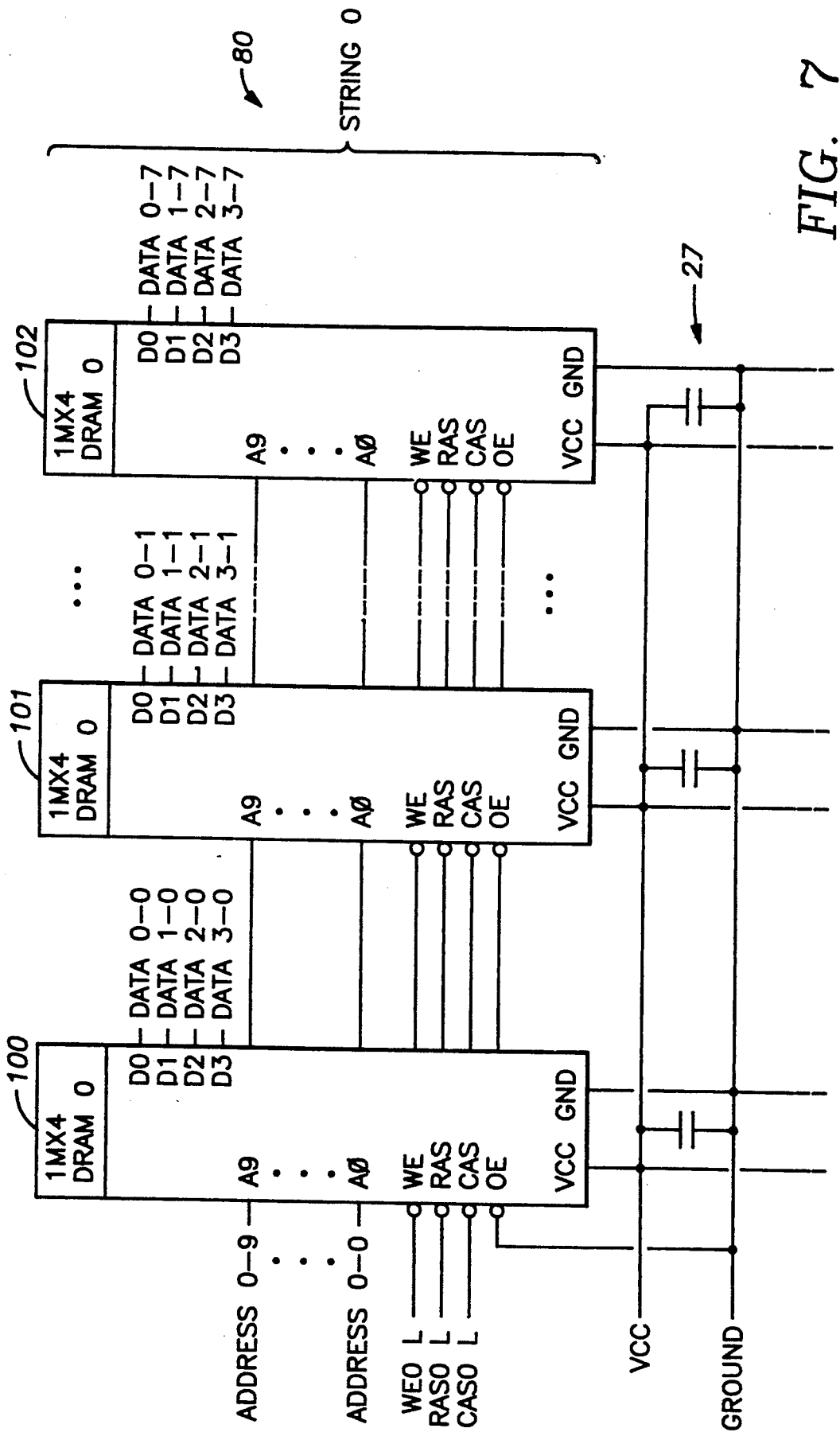
FIG. 7 is a schematic diagram of a string of DRAMs used in the memory module of FIG. 1.

Turning now to FIG. 7, there is shown a more detailed schematic diagram for the DRAMs included in the first string 80. There are eight DRAMs in the string, although only the first two DRAMs 100, 101 and the seventh DRAM 102 are shown in FIG. 7. The five DRAMs which are included in the string 0 but which are not shown, have their address inputs A9—A0, their write enable input WE, their row address input RAS, their column address strobe input CAS, their output enable input OE, their supply voltage VCC, and their ground GND inputs connected in parallel with the corresponding inputs of the other DRAMs 100, 101, 102. Each of the DRAMs 100, 101, 102 has four data output pins D0, D1, D2, D3 which are connected to respective lines of the four 8-bit data busses DATA 0, DATA 1, DATA 2, and DATA 3. The supply pin VCC and the ground GND for each of the DRAMs 100, 101, 102 is shunted by a respective one of the decoupling capacitors generally designated 27. Each of the decoupling capacitors 27 has a value, for example, of 0.22 microfarads.

As shown in FIGS. 1 and 2, each of the DRAMs 21, 22, 23, 24 is designated by "S0" to indicate that the DRAM is in the first string 80, "S1" to indicate that the DRAM is in the second string 81, "S2" to indicate that the DRAM is in the third string 82, and "S3" to indicate that the DRAM is in the fourth string 83. The layout of the address buses is facilitated by an organization of the chips in which the first and second strings are mounted on one side of the printed wiring board 25, the second and third strings are mounted on the other side of the printed wiring board, each DRAM in the first string is in registration with a corresponding DRAM in the third sting on the opposite side of the board, and each DRAM in the second string is in registration with a corresponding DRAM in the fourth string of chips. In the preferred wiring for 1M×4 DRAMs as defined by the mask works in FIGS. 9 to 12, each one of the four strings corresponds to a particular one of the four rows.

Turning now to FIG. 8, there is shown a schematic diagram of the arrangement of address, data and control signals along the series of terminals 30 of the memory module 20. The schematic diagram in FIG. 8 illustrates that the ground, power supply (VCC) data busses 87, 88, 89, 90, and the address busses, 84, 85 are distributed along the length of the series of terminals 30. The second address bus 85, however, has its terminals in the series 30 disposed between the terminals of a first half 104 and a second half 105 of the first address bus 84. The specific signal designation for each of the 80 terminals in the series 30 are given in the following Table I.

TABLE I

| PIN NUMBER | EDGE CONNECTOR PIN ASSIGNMENTS MEMORY MODULE SIGNAL DESIGNATION |
|---|---|
| 1 | DATA 0-0 |
| 2 | DATA 1-0 |
| 3 | ADDRESS 0-11 |
| 4 | ADDRESS 0-10 |
| 5 | GROUND |
| 6 | ADDRESS 0-9 |
| 7 | ADDRESS 0-8 |
| 8 | DATA 2-0 |
| 9 | DATA 3-0 |
| 10 | VCC |
| 11 | ADDRESS 0-7 |
| 12 | ADDRESS 0-6 |
| 13 | DATA 0-1 |
| 14 | DATA 1-1 |
| 15 | WE 1 |
| 16 | VCC |
| 17 | ADDRESS 1-11 |
| 18 | ADDRESS 1-10 |
| 19 | DATA 2-1 |
| 20 | DATA 3-1 |
| 21 | ADDRESS 1-9 |
| 22 | GROUND |
| 23 | DATA 0-2 |
| 24 | DATA 1-2 |
| 25 | ADDRESS 1-8 |
| 26 | ADDRESS 1-7 |
| 27 | ADDRESS 1-6 |
| 28 | VCC |
| 29 | ADDRESS 1-5 |
| 30 | DATA 2-2 |
| 31 | DATA 3-2 |
| 32 | DATA 0-3 |
| 33 | DATA 1-3 |
| 34 | GROUND |
| 35 | CAS0 |
| 36 | RAS 0 |
| 37 | RAS 1 |
| 38 | GROUND |
| 39 | DATA 2-3 |
| 40 | DATA 3-3 |
| 41 | DATA 0-4 |
| 42 | DATA 1-4 |
| 43 | RAS 2 |
| 44 | RAS 3 |
| 45 | GROUND |
| 46 | CAS 1 |
| 47 | ADDRESS 1-4 |
| 48 | DATA 2-4 |
| 49 | DATA 3-4 |
| 50 | VCC |
| 51 | DATA 0-5 |
| 52 | DATA 1-5 |
| 53 | ADDRESS 1-3 |
| 54 | ADDRESS 1-2 |
| 55 | VCC |
| 56 | ADDRESS 1-1 |
| 57 | ADDRESS 1-0 |
| 58 | DATA 2-5 |
| 59 | DATA 3-5 |
| 60 | GROUND |
| 61 | ADDRESS 0-5 |
| 62 | DATA 0-6 |
| 63 | DATA 1-6 |

TABLE I-continued

EDGE CONNECTOR PIN ASSIGNMENTS

| PIN NUMBER | MEMORY MODULE SIGNAL DESIGNATION |
| --- | --- |
| 64 | ADDRESS 0-4 |
| 65 | VCC |
| 66 | ADDRESS 0-3 |
| 67 | ADDRESS 0-2 |
| 68 | DATA 2-6 |
| 69 | DATA 3-6 |
| 70 | ADDRESS 0-1 |
| 71 | VCC |
| 72 | DATA 0-7 |
| 73 | DATA 1-7 |
| 74 | ADDRESS 0-0 |
| 75 | WE 0 |
| 76 | GROUND |
| 77 | DRAM NO. |
| 78 | STRING |
| 79 | DATA 2-7 |
| 80 | DATA 3-7 |

Figure 13:
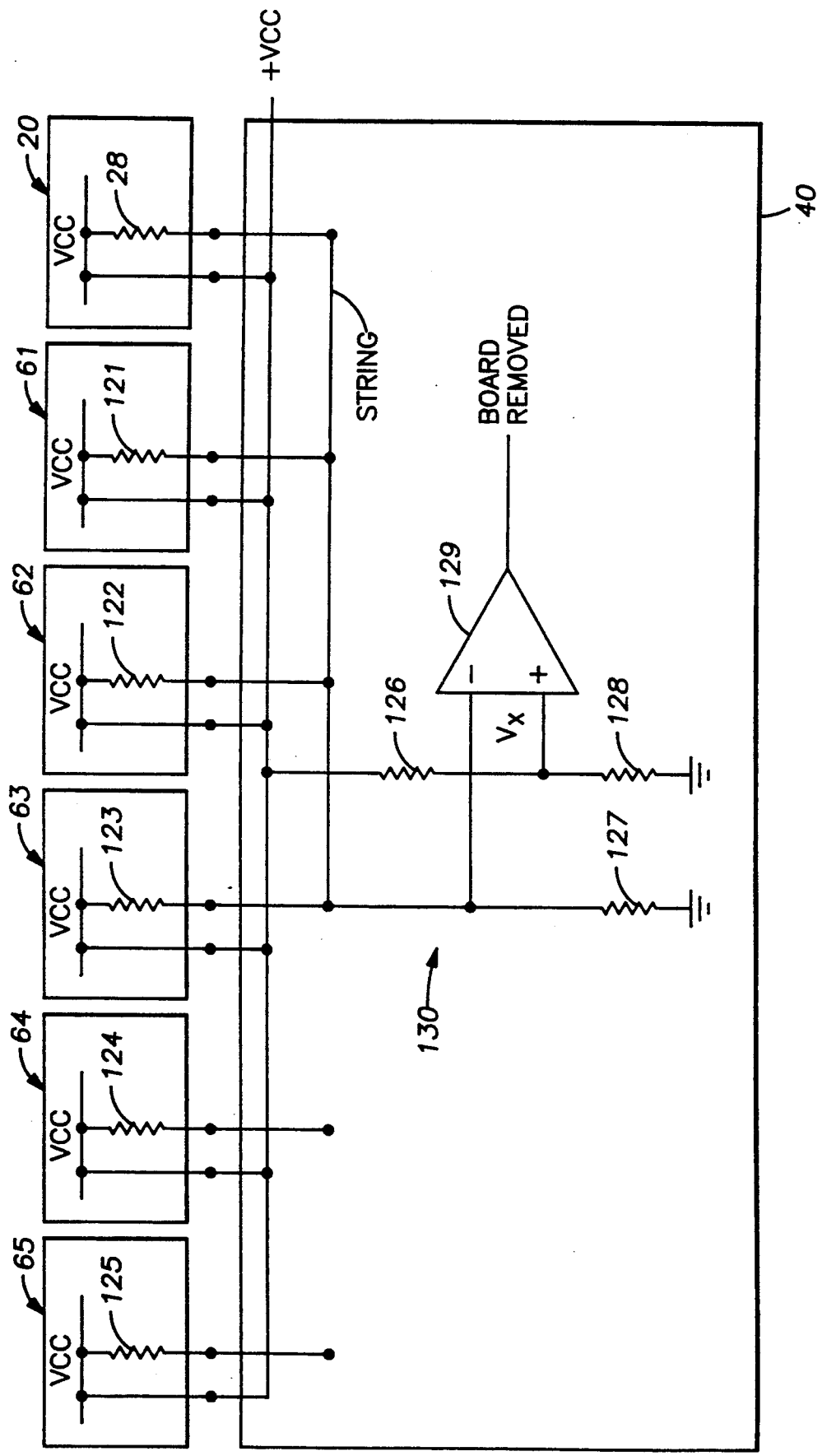
FIG. 13 is a schematic diagram of a circuit using resistors mounted on respective memory modules for detecting whether or not a memory module is removed from a motherboard.

Turning now to FIG. 13, there is shown a schematic diagram of a proposed circuit for using resistors mounted on respective memory modules for detecting whether or not one of the memory modules 20, 61, 62, 63 is removed from the motherboard 40. Each of the memory modules 20, 61, 62, 63, 64, 65 has a respective resistor 28, 121, 122, 123, 124, 125. The resistors 28, 121, 122, 123 are wired in parallel to provide a "STRING" signal. Preferably, each of the resistors 29, 121, 122, 123, 124, 125 has the same value, for example, 10K ohm, so that the parallel resistance of the resistors 29, 121, 122, 123, 124, 125 is given by the value $R_x$ of an individual resistor divided by the number N of memory modules that are inserted into the motherboard 40 at locations having the resistors wired in parallel to provide the string signal.

To determine whether or not one of the memory modules 20, 61, 62, 63 is removed from the motherboard 40, the parallel resistance $R_x/N$ is part of a bridge circuit 130 including resistors 126, 127, 128. The resistors 126, 127 and 128, for example, have a value of $R_x/(N-0.5)$. A voltage $V_x$ across the bridge is sensed by a comparator 129. The comparator 129 therefore outputs a high logic signal when any one of the memory modules 20, 61, 62, 63 is removed, and otherwise asserts a low logic signal.

The analog sensing scheme of FIG. 13 provides an advantage over schemes such as a daisy chain through each of the memory modules, because the detection scheme of FIG. 13 requires only one edge connector pin per memory module. The detection scheme of FIG. 13 has the further advantage that the same motherboard circuitry can be used for memory systems including a different number of boards. For example, the same motherboard 40 can be used for a system having only six memory modules, as shown in FIG. 13, or, for example, in a system having only three memory modules. For a system having only three memory modules, the resistor on each memory module should have a value of about ½ the resistance of the resistor used on a memory module in the system having six memory boards. In other words, any system having a complete set of boards should provide about the same parallel resistance to the bridge circuit 130 on the motherboard 40. In particular, the resistor on each memory module in an alternative system should have a value $R_y$ that is about $M-0.5$ times the value of the resistance 127 in the bridge circuit 130, where M is the number of memory modules in the alternative system that are disposed at locations of the motherboard receiving memory modules having resistors wired in parallel to provide the STRING signal.

It should be appreciated that the sensitivity of the circuit shown in FIG. 13 to resistor tolerances increases when the circuit includes a large number of memory modules having resistors wired in parallel to provide the STRING signal. Due to this difficulty, it is advantageous in systems having a large number of memory modules to sense the presence or absence of only the memory modules that are most likely to be removed from the motherboard. For the configuration shown in FIG. 5, for example, the most exposed memory modules 20, 61, etc., are more likely to be removed from the motherboard 40 than the less exposed memory modules 65, 64, etc.

In view of the above, there has been described a very compact memory module adapted to efficient memory access on an interleaved basis. Each memory module provides thirty-two bits of data per memory access cycle, each memory module has two independent address buses, and each memory module has four strings, to provide four-way interleaving among two memory banks. A single memory module could provide a complete four-way interleaved memory for a compact thirty-two bit computer. An increased number of the memory modules can be used to provide larger word sizes with or without additional parity or error-correction coding bits, or to provide memory for an increased number of words.

Modifications within the scope of the following claims should be readily apparent to persons skilled in the art. Read-only memory chips, for example, could be substituted for the DRAM chips to construct a read-only memory module. In this case, write enable signals would not be needed for controlling the read-only memory chips.

What is claimed is:

1. A memory module for installation on a motherboard, said memory module comprising:
   a multiplicity of memory integrated circuit chips, each having address, data, control, power and ground terminals;
   a multi-layer printed wiring board having address, data, control, power and ground wiring connected to said address, data, control, power and ground terminals of said memory integrated circuit chips; said printed wiring board also having a series of terminals disposed along an edge portion of said printed wiring board for connecting said address, data, control, power and ground wiring to said motherboard; and
   a plurality of decoupling capacitors mounted on said printed wiring board and connected to said power and ground wiring;
   wherein said memory integrated circuit chips are arranged as a first rectangular matrix of rows and columns of said memory integrated circuit chips on one side of said printed wiring board, and a second rectangular matrix of rows and columns of said memory integrated circuit chips on an opposite side of said printed wiring board;
   wherein said control wiring includes a first row address strobe line, a second row address strobe line, a third row address strobe line, a fourth row address strobe line, a first column address strobe line and a second column address strobe line; said memory integrated circuit chips include a first group of a plurality of said chips (a first "string") for which each chip in said first group has a row address strobe terminal connected to said first row address strobe line and a column address strobe terminal connected to said first column address strobe line, a second group of a plurality of said chips (a second "string") for which each chip in said second group has a row address strobe terminal connected to said second row address strobe line and a column address strobe terminal connected to said second column address strobe line, a third group of a plurality of said chips (a third "string") for which each chip in said third group has a row address strobe terminal connected to said third row address strobe line and a column address strobe terminal connected to said first column address strobe line, and a fourth group of a plurality of said chips (a fourth "string") for which each chip in said fourth group has a row address strobe terminal connected to said fourth row address strobe line and a column address strobe terminal connected to said second column address strobe line, and wherein said address wiring includes a first address bus having a first set of address lines connecting in parallel address terminals of each chip in said first and third groups, and a second address bus separate from said first address bus, said second address bus having a second set of address lines connecting in parallel address terminals of each chip in said second and fourth groups; and wherein said data wiring includes a common data bus having data lines each of which is connected to a chip in said first group, a chip in said second group, a chip in said third group, and a chip in said fourth group.

2. The memory module as claimed in claim 1, wherein said first and second groups of chips are mounted on one side of said printed wiring board, said third and fourth groups of chips are mounted on the other side of said printed wiring board, each chip in said first group of chips is in registration with a corresponding chip in said third group of chips, and each chip in said second group of chips is in registration with a corresponding chip in said fourth group of chips.

3. The memory module as claimed in claim 2, wherein each of said groups of chips corresponds to one of said rows of said matrices.

4. The memory module as claimed in claim 1, wherein said decoupling capacitors are arranged in rows and are aligned between the rows of chips on each side of the printed wiring board.

5. The memory module as claimed in claim 1, wherein power, ground, address, and data terminals are distributed and dispersed along said series of terminals, but terminals in said series for one of said address buses are disposed between a first half of terminals for the other of said address buses and a second half of terminals for said other of said address buses.

6. The memory module as claimed in claim 1, wherein said memory module includes a first resistor and a second resistor, and said series of terminals includes a first terminal connected to said first resistor and a second terminal connected to said second resistor.

7. The memory module as claimed in claim 6, wherein said first resistor is mounted on one side of the printed wiring board, and the second resistor is mounted on the other side of the printed wiring board.

8. The memory module as claimed in claim 6, wherein said first terminal is connected through said first resistor to the power and ground wiring, and said second terminal is connected through said second resistor to the power and ground wiring.

9. The memory module as claimed in claim 1, wherein said first matrix includes two rows and eight columns of said chips, said second matrix includes two rows and eight columns of said chips, said first group includes eight of said chips, said second group includes eight of said chips, said third group includes eight of said chips, and said fourth group includes eight of said chips.

10. The memory module as claimed in claim 1, wherein said memory integrated circuit chips are encased in thin packages having a thickness of about 0.05 inches, and said printed wiring board has a thickness of about 0.05 inches, so that said memory module has a thickness of about 0.15 inches.

11. The memory module as claimed in claim 1, wherein said memory integrated circuit chips are $1M \times 4$ bit DRAMs and said memory module has a memory capacity of 16 megabytes.

12. The memory module as claimed in claim 1, wherein said memory integrated circuit chips are $4M \times 4$ bit DRAMs and said memory module has a memory capacity of 64 megabytes.

13. The memory module as claimed in claim 1, wherein said printed wiring board consists of six copper layers and five epoxy-fiberglass layers.

14. A memory module for installation on a motherboard, said memory module comprising:

thirty-two memory integrated circuit chips, each having address, data, control, power and ground terminals;

a multi-layer printed wiring board having address, data, control, power and ground wiring connected to said address, data, control, power and ground terminals of said memory integrated circuit chips; said printed wiring board also having a series of terminals disposed along an edge portion of said printed wiring board for connecting said address, data, control, power and ground wiring to said motherboard; said printed wiring board having six copper layers and five epoxy-fiberglass layers; and a plurality of decoupling capacitors mounted on said printed wiring board and connected to said power and ground wiring;

wherein said thirty-two memory integrated circuit chips are arranged as a first rectangular matrix of two rows and eight columns of said memory integrated circuit chips on one side of said printed wiring board, and a second rectangular matrix of two rows and eight columns of said memory integrated circuit chips on an opposite side of said printed wiring board so that each integrated circuit chip in said first matrix is in registration with a corresponding integrated circuit chip in said second matrix;

wherein said decoupling capacitors include a first row of eight decoupling capacitors aligned between the two rows of chips on one side of the printed wiring board, and a second row of eight decoupling capacitors aligned between the two rows of chips on the other side of the printed wiring board;

wherein said control wiring includes a first row address strobe line, a second row address strobe line, a third row address strobe line, a fourth row address strobe line, a first column address strobe line and a second column address strobe line; said thirty-two memory integrated circuit chips include a first group of eight of said chips (a first "string") for which each chip in said first group has a row address strobe terminal connected to said first row address strobe line and a column address strobe terminal connected to said first column address strobe line, a second group of eight of said chips (a second "string") for which each chip in said second group has a row address strobe terminal connected to said second row address strobe line and a column address strobe terminal connected to said second column address strobe line, a third group of eight of said chips (a third "string") for which each chip in said third group has a row address strobe terminal connected to said third row address strobe line and a column address strobe terminal connected to said first column address strobe line, and a fourth group of eight of said chips (a fourth "string") for which each chip in said fourth group has a row address strobe terminal connected to said fourth row address strobe line and a column address strobe terminal connected to said second column address strobe line, wherein said address wiring includes a first address bus having a first set of address lines connecting in parallel address terminals of each chip in said first and third groups, and a second address bus separate from said first address bus, said second address bus having a second set of address lines connecting in parallel address terminals of each chip in said second and fourth groups; and wherein said data wiring includes a common data bus having data lines each of which is connected to a chip in said first group, a chip in said second group, a chip in said third group, and a chip in said fourth group.

15. The memory module as claimed in claim 14, wherein said first and second groups of chips are mounted on one side of said printed wiring board, and said third and fourth groups of chips are mounted on the other side of said printed wiring board, each chip in said first group of chips is in registration with a corresponding chip in said third group of chips, and each chip in said second group of chips is in registration with a corresponding chip in said fourth group of chips.

16. The memory module as claimed in claim 14, wherein power, ground, address, and data terminals are distributed and dispersed along said series of terminals, but terminals in said series for one of said address buses are disposed between a first half of terminals for the other of said address buses and a second half of terminals for said other of said address buses.

17. The memory module as claimed in claim 14, wherein said memory module includes a first resistor and a second resistor, said series of terminals includes a first terminal connected to said first resistor and a second terminal connected to said second resistor, said first terminal is connected through said first resistor to the power and ground wiring, and said second terminal is connected through said second resistor to the power and ground wiring.

18. A memory system comprising a motherboard having a multiplicity of electrical connectors each of which has a plurality of terminals, and a multiplicity of memory modules connected by respective ones of said electrical connectors to said motherboard, each of said memory modules having a resistor making an electrical connection to a terminal in a respective one of said electrical connectors, and the motherboard having wiring connected to a plurality of said electrical connectors to interconnect the resistors of a plurality of said memory modules to provide a combined resistance responsive to insertion and removal of ones of said plurality of memory modules, and a logic circuit responsive to said combined resistance for determining whether or not a predetermined number of said plurality of memory modules are connected to said motherboard by said plurality of electrical connectors.

19. The memory system as claimed in claim 18, wherein said multiplicity of electrical connectors include a group of said electrical connectors for connecting memory modules which are relatively inaccessible for insertion and removal, and said wiring is not connected to electrical connectors in said group of said electrical connectors.

20. The memory system as claimed in claim 18, wherein said logic circuit includes a comparator sensing a voltage from a resistance bridge including said combined resistance.

* * * * *